United States Patent
Desai et al.

(10) Patent No.: US 12,342,496 B2
(45) Date of Patent: Jun. 24, 2025

(54) ELECTRICAL PANELBOARD ASSEMBLY INCLUDING POWER DISTRIBUTION HEATSINK ASSEMBLY, SYSTEMS AND METHODS

(71) Applicant: EATON INTELLIGENT POWER LIMITED, Dublin (IE)

(72) Inventors: Jayram Desai, Maharashtra (IN); Graig E. DeCarr, Cicero, NY (US); Michael Raddell, Phoenix, NY (US)

(73) Assignee: Eaton Intelligent Power Limited, Dublin (IE)

( * ) Notice: Subject to any disclaimer, the term of this patent is extended or adjusted under 35 U.S.C. 154(b) by 324 days.

(21) Appl. No.: 18/054,425

(22) Filed: Nov. 10, 2022

(65) Prior Publication Data
US 2023/0146112 A1    May 11, 2023

Related U.S. Application Data
(60) Provisional application No. 63/278,367, filed on Nov. 11, 2021.

(51) Int. Cl.
| | | |
|---|---|---|
| H05K 7/20 | (2006.01) | |
| H01H 71/02 | (2006.01) | |
| H01H 9/52 | (2006.01) | |

(52) U.S. Cl.
CPC ....... *H05K 7/20154* (2013.01); *H01H 71/025* (2013.01); *H01H 71/0271* (2013.01); *H05K 7/20409* (2013.01); *H01H 9/52* (2013.01)

(58) Field of Classification Search
CPC .......... H05K 7/20154; H05K 7/20409; H01H 71/025; H01H 71/0271; H01H 9/52;
(Continued)

(56) References Cited

U.S. PATENT DOCUMENTS

| | | | |
|---|---|---|---|
| 3,879,100 A | | 4/1975 | Chabot |
| 4,015,173 A | * | 3/1977 | Nitsche ................. H02M 7/003 |
| | | | 361/728 |

(Continued)

FOREIGN PATENT DOCUMENTS

| | | |
|---|---|---|
| DE | 202016100468 U1 | 5/2016 |
| EP | 2978074 A1 | 1/2016 |

OTHER PUBLICATIONS

Eaton: Power Distribution SynergEX Panelboards, Jul. 21, 2021, XP093024638, Retrieved from the Internet: URL: https://www.eaton.com/content/dam/eato n/products/low-voltage-power-distributioncontrols-systems/crouse-hinds/literature/crouse-hinds-synergex-panelboard-brochure.pdf [retrieved on Feb. 16, 2023] p. 2-5.
(Continued)

*Primary Examiner* — Stephen S Sul
(74) *Attorney, Agent, or Firm* — Merchant & Gould P.C.

(57) ABSTRACT

A panelboard assembly for a harsh and/or hazardous environment is provided. The panelboard assembly includes a core assembly. The core assembly includes a main breaker assembly configured to be electrically connected to a power supply, and a branch breaker assembly electrically connected to the main breaker assembly and configured to be electrically connected to one or more loads, and a power distribution heatsink assembly. The power distribution heatsink assembly includes an electrically-conductive heatsink having a first end and an opposing second end, the first end electrically connected to the core assembly and an electrically-nonconductive isolator electrically insulating the heatsink.

20 Claims, 9 Drawing Sheets

(58) Field of Classification Search
CPC ... H02B 1/20; H02B 1/56; H02B 1/28; H01R 13/533
USPC .............................. 361/676; 174/15.1–16.3
See application file for complete search history.

(56) References Cited

U.S. PATENT DOCUMENTS

| | | | |
|---|---|---|---|
| 8,514,552 B2* | 8/2013 | Mills ..................... | H05K 7/209 361/709 |
| 8,754,341 B2 | 6/2014 | Manahan et al. | |
| 8,821,622 B2 | 9/2014 | Manahan et al. | |
| 9,668,385 B2 | 5/2017 | Manahan et al. | |
| 10,292,310 B2 | 5/2019 | Maloney et al. | |
| 11,158,998 B1* | 10/2021 | Fonseca ................... | H02B 1/56 |
| 2016/0028216 A1* | 1/2016 | Pal ......................... | H01H 85/47 361/676 |
| 2018/0184544 A1* | 6/2018 | Maloney ................. | F28F 21/04 |
| 2021/0328413 A1* | 10/2021 | Mathew ................... | H02G 5/10 |
| 2022/0087055 A1* | 3/2022 | Kendzia, III ....... | H01L 23/3672 |

OTHER PUBLICATIONS

International Search Report and Written Opinion Application No. PCT/EP2022/025505 Mar. 2, 2023.

* cited by examiner

ELECTRICAL PANELBOARD ASSEMBLY INCLUDING POWER DISTRIBUTION HEATSINK ASSEMBLY, SYSTEMS AND METHODS

CROSS-REFERENCE TO RELATED APPLICATIONS

This application claims the benefit of U.S. Provisional Patent Application No. 63/278,367, filed Nov. 11, 2021. The disclosure of the priority application in its entirety is hereby incorporated by reference into the presence application.

BACKGROUND

The field of the invention relates generally to electrical panelboard assemblies, and more particularly to panelboard assemblies for a harsh and/or hazardous environment.

During operation of panelboard assemblies, heat is generated. In some cases, the amount of heat generated may lead to electrical components within the panelboard assembly exceeding a desired temperature rise. If the temperature rise of electrical components within the panelboard assembly is not be kept below certain limits, the components may become damaged, or the panelboard assembly may not meet requirements for certifications and/or standards.

While known panelboard assemblies are satisfactory in some applications, they remain disadvantaged and improvements are desired.

BRIEF DESCRIPTION OF THE DRAWINGS

Non-limiting and non-exhaustive embodiments are described with reference to the following Figures, wherein like reference numerals refer to like parts throughout the various drawings unless otherwise specified.

DETAILED DESCRIPTION

Figure 1:
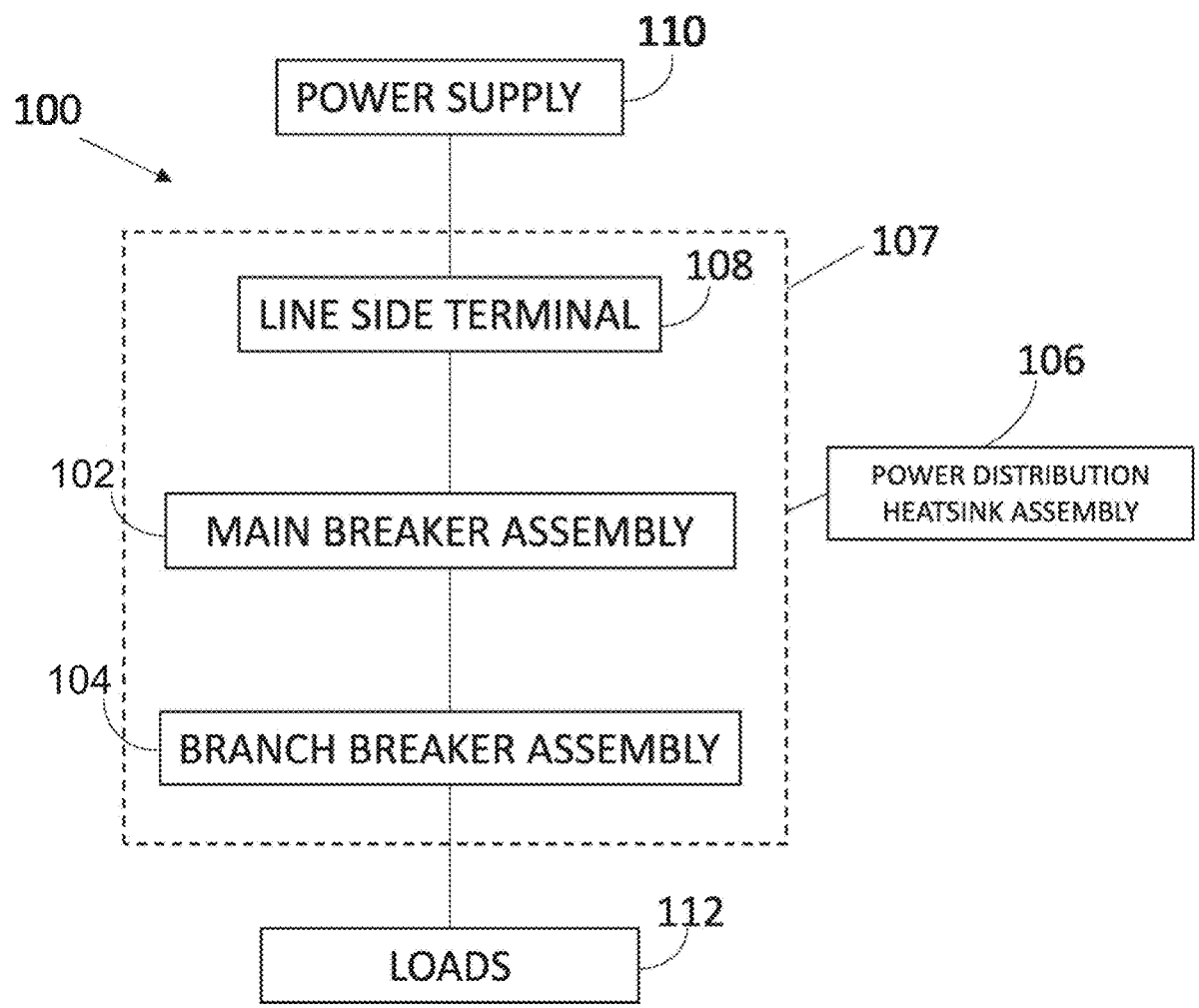
FIG. 1 is a schematic diagram of an exemplary panelboard assembly.

The disclosure includes panelboard assemblies for a harsh and/or hazardous environment. A power distribution heatsink assembly is included in a panelboard assembly and is electrically connected to other components of the panelboard assembly to provide better dissipation of heat in the panelboard assembly than conventional heatsinks. Method aspects of assembling electrical assemblies will be in part apparent and in part explicitly discussed in the following description.

Electrical power systems sometimes operate within hazardous environments presenting a risk of explosion via ignition of a surrounding gas or vapor dusts, fibers, or flyings. Such hazardous environments may arise, for example without limitation, in petroleum refineries, petrochemical plants, grain silos, waste water treatment facilities and/or other industrial facilities, wherein volatile conditions are produced in the ambient environment and present a heightened risk of fire or explosion. A temporary or sustained presence of airborne ignitable gas, ignitable vapors, ignitable dust or otherwise flammable substances presents substantial concerns regarding safe and reliable operation of such facilities overall, including but not limited to safe operation of the electrical power system itself, which in some instances by virtue of conventional circuit protector devices may produce ignition sources in normal operation and in the presence of an electrical fault. As such, a number of standards have been promulgated relating to electrical product use in explosive environments to improve safety in hazardous locations in view of an assessed probability of explosion or fire risk.

For example, Underwriter's Laboratories ("UL") standard UL 1203 sets forth Explosion-Proof and Dust-Ignition-Proof Electrical Equipment criteria for hazardous locations. Explosion-Proof and Dust-Ignition-Proof enclosures are available to enclose or contain electrical products. In combination with appropriate Explosion-Proof and Dust-Ignition-Proof enclosures, electrical equipment manufacturers may receive UL certification of compliance with the applicable rating standards for hazardous locations, and UL certification is an important aspect of a manufacturer's ability to successfully bring products to market in North America or any other market accepting of UL standard 1203.

The National Electric Code (NEC) generally classifies hazardous locations by class and division. Class I locations are those in which flammable vapors and gases may be present. Class II locations are those in which combustible dust may be found. Class III locations are those which are hazardous because of the presence of easily ignitable fibers or flyings. Considering Class I, Division 1 covers locations where flammable gases or vapors may exist under normal operating conditions, under frequent repair or maintenance operations, or where breakdown or faulty operation of process equipment might also cause simultaneous failure of electrical equipment. Division 1 presents a greater risk of explosion than, for example, Division 2 where flammable gases or vapors are normally handled either in a closed system, confined within suitable enclosures, or are normally prevented by positive mechanical ventilation.

The International Electrotechnical Commission (IEC) likewise categorizes hazardous locations into Class I, Zone 0, 1, or 2 representing locations in which flammable gases or vapors are or may be airborne in an amount sufficient to produce explosive or ignitable mixtures. As defined in the IEC, a Class I, Zone 0 location is a location in which ignitable concentrations of flammable gases or vapors are present continuously or for long periods of time. A Class I, Zone 1 location is a location in which ignitable concentrations of flammable gases or vapors are likely to exist because of repair or maintenance operations or because of leakage or possible release of ignitable concentrations of flammable gases or vapors, or is a location that is adjacent to a Class I, Zone 0 location from which ignitable concentrations of vapors could be communicated.

Given that electrical devices, such as those described below, may be ignition sources in certain circumstances, explosion-proof, flame-proof, or ignition proof enclosures are conventionally provided in NEC Division 1 or 2 locations and/or IEC Zone 1 or 2 locations to house electrical devices that pose ignition risk. The terms "explosion-proof" or "flame-proof" in this context, refer to enclosures that are designed to be capable of containing an internal explosion of a specified flammable vapor-air mixture.

In addition to hazardous locations discussed above, so-called harsh locations also require specific focus in the design of panelboard assemblies used therewith. Harsh locations may entail corrosive elements and the like in the atmosphere that are not necessarily explosive and/or are subject to temperature cycling, pressure cycling, shock and/or mechanical vibration forces that are typically not present in non-harsh operating environments. Of course, some locations in which panelboard assemblies are desirably employed are both harsh and hazardous by nature, and are therefore designed for various operating conditions, for which typical panelboard assemblies for other uses are unsatisfactory.

In a harsh and/or hazardous environment, a temperature rise of a panelboard assembly during operation needs to be managed to be a level required by standards for the harsh and/or hazardous environment such that the panelboard assembly does not pose as a fire or explosion hazard. Systems, assemblies, and methods described herein provide panelboard assemblies that are safely operable and meet requirements on temperature rises for the harsh and/or hazardous environment, especially when a high amperage current, such as 225 Amperes (A) or above, flows through the panelboard assembly. The panelboard assembly described herein includes a power distribution heatsink assembly that is electrically connected to components of the panelboard assembly to increase heat dissipation. The power distribution heatsink assembly may also serve as a power distribution block in the panelboard assembly.

FIG. 1 is a schematic diagram of an exemplary panelboard assembly 100. In the exemplary embodiment, panelboard assembly 100 includes a core assembly 107. Core assembly 107 includes a main breaker assembly 102 and a branch breaker assembly 104. Core assembly 107 may include other components such as a contactor assembly (not shown). Core assembly 107 may further include a line side terminal 108, which is configured to be electrically connected to a power supply 110. Power supply 110 may be an alternating current (AC) power supply such as a three-phase AC power supply, or a direct current (DC) power supply. Main breaker assembly 102 is electrically connected to line side terminal 108 and configured to switch the entire panelboard assembly 100 on or off as needed, irrespective of any secondary circuit breaker or switch associated with branch breaker assembly 104.

In the contemplated embodiment, main breaker assembly 102 is electrically connected to branch breaker assembly 104, which is configured to control one or more loads 112. Branch breaker assembly 104 includes one or more branch circuit breakers 114 (shown in FIGS. 2A and 2B described later). Branch circuit breaker 114 is electrically connected to one or more loads 112 and is configured to individually switch the connected loads 112 on or off.

In the exemplary embodiment, panelboard assembly 100 further includes a power distribution heatsink assembly 106. Power distribution heatsink assembly 106 is electrically connected to core assembly 107 or other components of panelboard assembly 100. For example, power distribution heatsink assembly 106 is electrically connected to main breaker assembly 102. In another example, power distribution heatsink assembly 106 is electrically connected to branch breaker assembly 104. Power distribution heatsink assembly 106 may be electrically connected between main breaker assembly 102 and branch breaker assembly 104. In some embodiments, power distribution heatsink assembly 106 is electrically connected to other components in panelboard assembly 100 than main breaker assembly 102 and branch breaker assembly 104. Alternatively, power distribution heatsink assembly 106 is electrically connected to any component(s) in panelboard assembly 100, including components other than main breaker assembly 102 and branch breaker assembly 104, as well as main breaker assembly 102 and/or branch breaker assembly 104. The number of power distribution heatsink assemblies 106 included in panelboard assembly 100 is not limited to one. Any number of power distribution heatsink assemblies 106 may be included in panelboard assembly 100, based on needs for heat dissipation.

As used herein, a power distribution heatsink assembly is electrically connected when an end of a heatsink of the power distribution heatsink assembly is electrically connected to at least one other component of the panelboard assembly. The power distribution heatsink assembly, however, may or may not form an electrical circuit with other components of the panelboard assembly when the power distribution heatsink assembly is electrically connected to other components in the panelboard assembly. In some embodiments, power distribution heatsink assembly 106 is connected to other components at only one point of electrical contact and does not form a circuit or a complete loop with other components. In other embodiments, power distribution heatsink assembly 106 are connected to other components at more than one point of electrical contact and form a circuit or a complete loop with other components with current flowing through the points of electrical contacts.

In contemplated embodiments, panelboard assembly 100 is adapted for use in a harsh and/or hazardous environment such as for lighting, motor applications, and other power system needs. Panelboard assembly 100 may also be used, however, in a non-hazardous environment as desired.

Figure 2A:
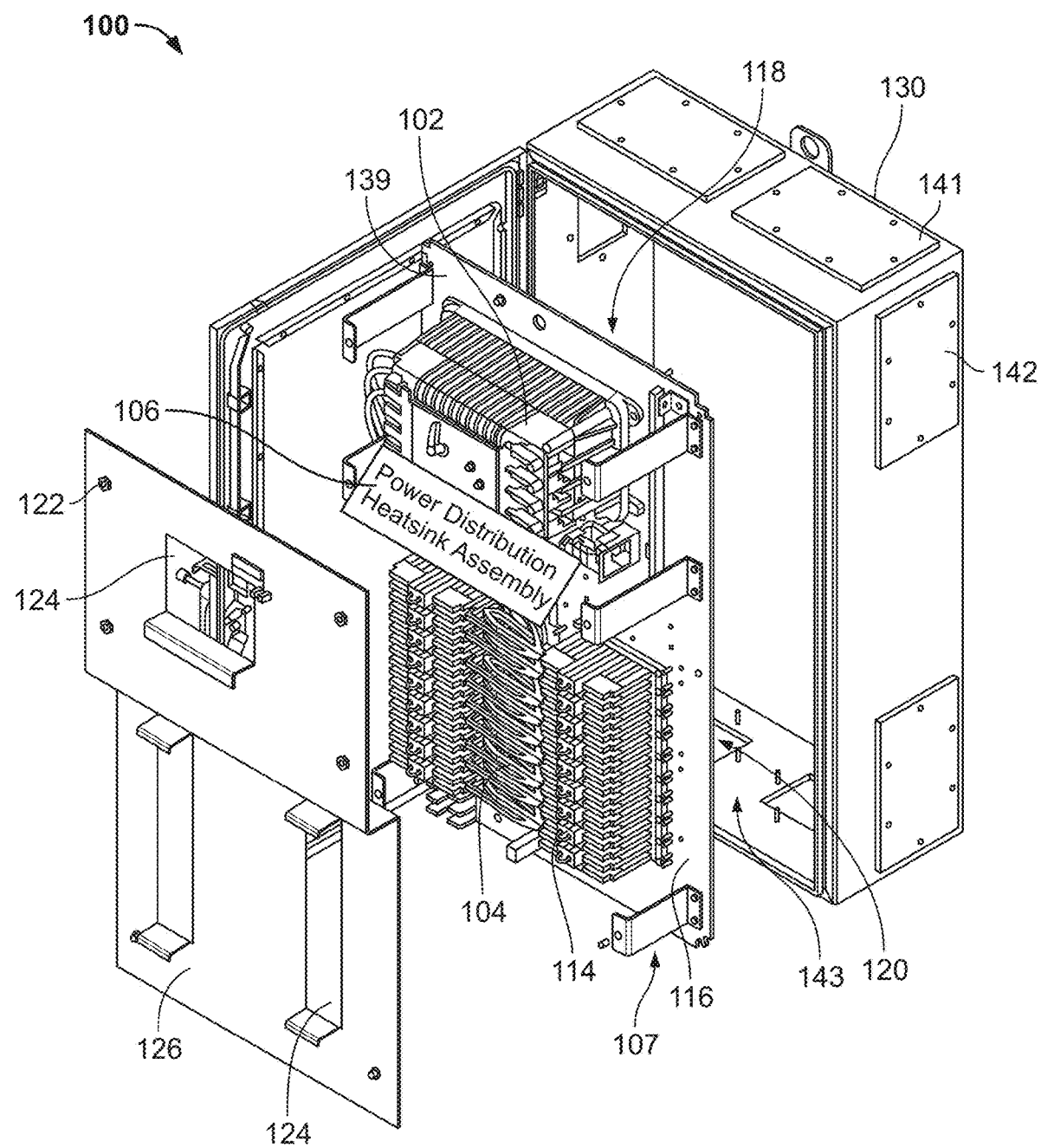
FIG. 2A is an exploded view of an exemplary embodiment of the panelboard assembly shown in FIG. 1.
Figure 2B:
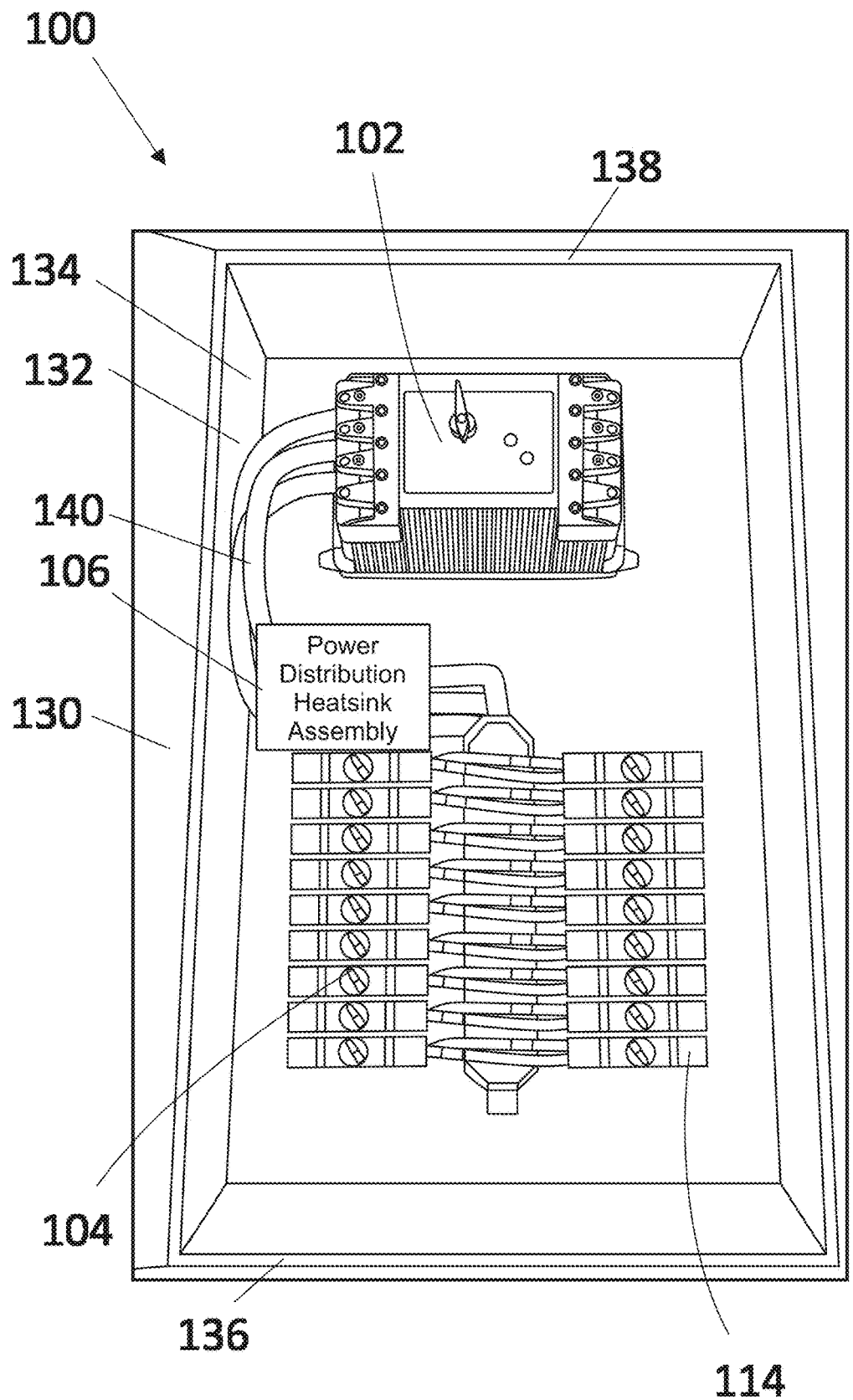
FIG. 2B is a front view of the panelboard assembly shown in FIG. 2A with the front cover removed.

FIGS. 2A and 2B show an exemplary embodiment of panelboard assembly 100. FIG. 2A is an exploded view of panelboard assembly 100. FIG. 2B is a front view of panelboard assembly 100 with a front cover of enclosure 130 removed. Panelboard assembly 100 may include a mounting board 116, on which electrical elements of panelboard assembly 100 such as main breaker assembly 102 and branch breaker assembly 104 are mounted. In the exemplary embodiment, panelboard assembly 100 may be divided into a main panel 118 and a branch panel 120. Main panel 118 may include main breaker assembly 102. Branch panel 120 may include branch breaker assembly 104. Panelboard assembly 100 may further include a main panel dead front 122. Main panel dead front 122 may be used to cover at least a portion of main panel 118. Main panel dead front 122 may further include one or more slots 124 that allow access to main breaker assembly 102 to switch main breaker assembly 102 on or off. Panelboard assembly 100 may also include a branch panel dead front 126 for covering at least a portion of branch panel 120. Branch panel dead front 126 may also include one or more slots 124 for access to branch breaker assembly 104. Panelboard assembly 100 may further include a power distribution block (not shown) that is electrically connected to both main breaker assembly 102 and branch breaker assembly 104.

In the exemplary embodiment, panelboard assembly 100 may further include an enclosure 130 that is used to enclose core assembly 107 such as main panel 118 and branch panel 120. Enclosure 130 also encloses main panel dead front 122 and branch panel dead front 126 if main panel dead front 122 and branch panel dead front 126 are used.

In the exemplary embodiment, panelboard assembly 100 further includes power distribution heatsink assembly 106. Power distribution heatsink assembly 106 is electrically connected to core assembly 107 such as main breaker assembly 102, branch breaker assembly 104, or any other component of panelboard assembly 100. In the depicted embodiment, power distribution heatsink assembly 106 is electrically connected between main breaker assembly 102 and branch breaker assembly 104 and also serves as a power distribution block of the panelboard assembly 100, where power distribution heatsink assembly 106 is used to distribute electrical power from an input power source to devices downstream.

Power distribution heatsink assembly 106 may be positioned at any location interior of enclosure 130. For example, power distribution heatsink assembly 106 is mounted on an interior wall 132 of enclosure 130. In one example, power distribution heatsink assembly 106 is mounted on a side wall 134 of enclosure 130 or a bottom wall 136 of enclosure 130. Power distribution heatsink assembly 106 may be positioned proximate main breaker assembly 102. In one example, power distribution heatsink assembly 106 is positioned with a closer distance from main breaker assembly than from other components of core assembly 107 such as branch breaker assembly 104. In some embodiments, power distribution heatsink assembly 106 is mounted on mounting board 116. In one example, power distribution heatsink assembly 106 is mounted on a side 143 of mounting board 116 opposite the side 139 where core assembly 107 is mounted.

In some embodiments, a portion of power distribution heatsink assembly 106 is positioned exterior of enclosure 130. For example, a portion of power distribution heatsink assembly 106 extends out of a top wall 138 or side wall 134 of enclosure 130, dissipating heat out of enclosure 130.

In the exemplary embodiment, panelboard assembly 100 is configured to be electrically connected to a three-phase AC power supply. Connection to a three-phase AC power supply is used only as an example herein. Panelboard assembly 100 may be connected to AC power supplies of other distribution configurations or a DC power supply. In the exemplary embodiment shown in FIGS. 2A and 2B, power distribution heatsink assembly 106 is electrically connected between main breaker assembly 102 and branch breaker assembly 104, also serving as a power distribution block of panelboard assembly 100.

Figure 3A:
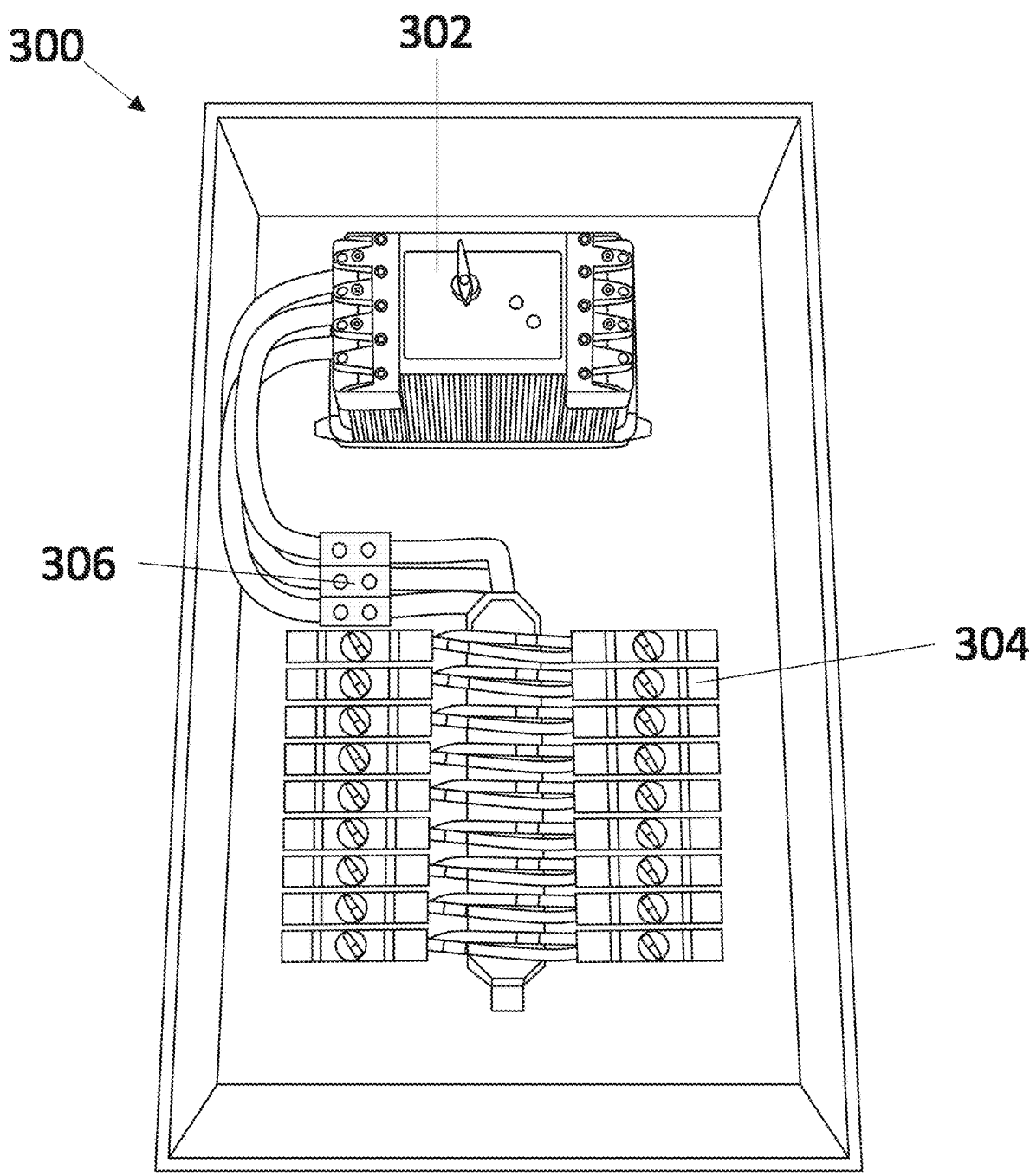
FIG. 3A is a front view of a known panelboard assembly with the front cover removed.
Figure 3B:
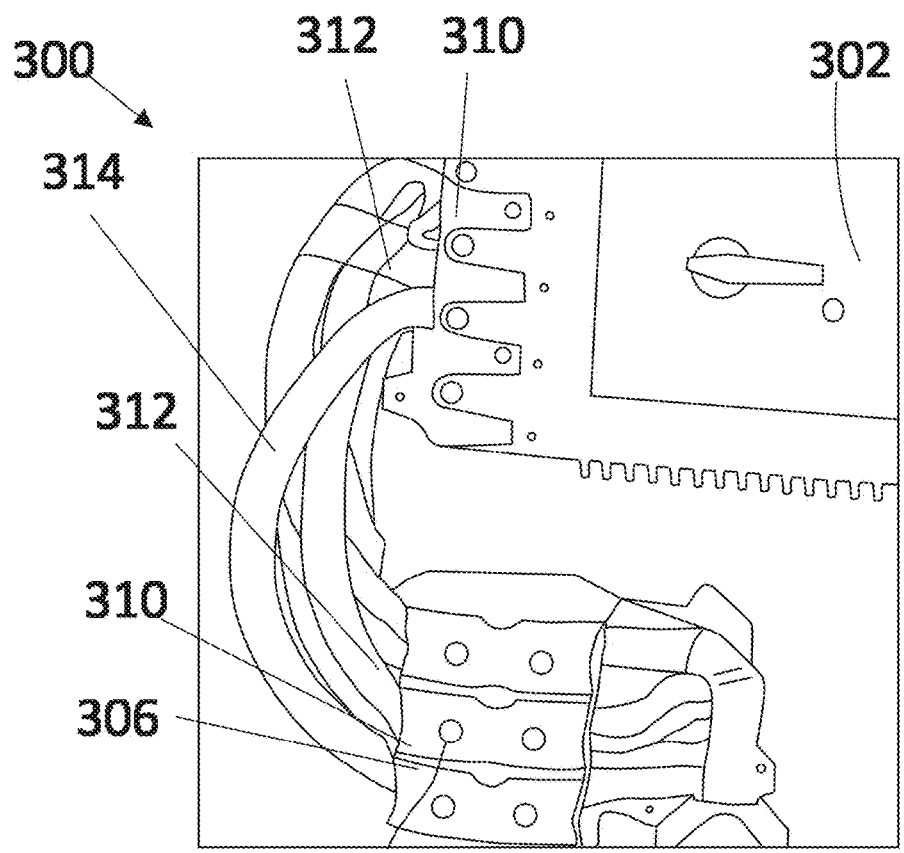
FIG. 3B is a thermal image showing portions of the known panelboard assembly shown in FIG. 3A.
Figure 3C:
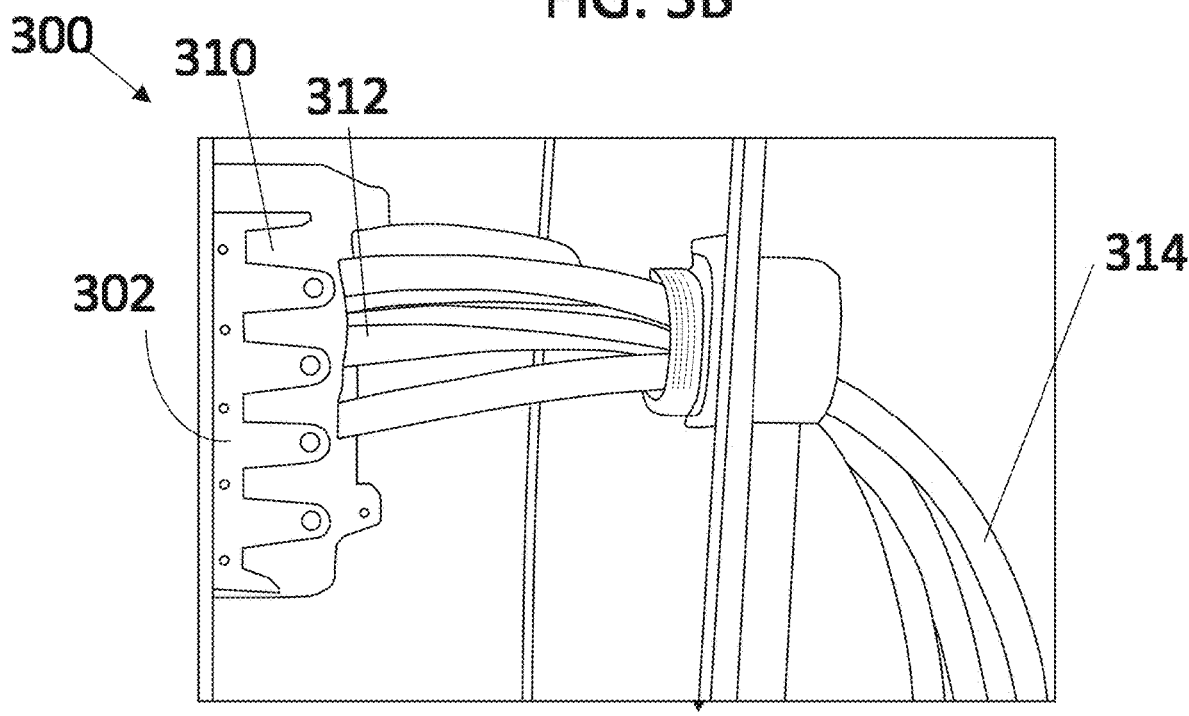
FIG. 3C is a thermal image showing other portions of the known panelboard assembly shown in FIG. 3A.

FIGS. 3A-3C show a front view of a known panelboard assembly 300 with the front cover removed (FIG. 3A) and thermal images of portions of panelboard assembly 300 during operation (FIGS. 3B and 3C). Known panelboard assembly 300 includes a main breaker assembly 302, a branch breaker assembly 304, and a power distribution block 306 positioned and electrically connected between main breaker assembly 302 and branch breaker assembly 304. FIG. 3B is a thermal image taken at a location between main breaker assembly 302 and power distribution block 306. FIG. 3C is a thermal image taken at a location where main breaker assembly exits panelboard assembly 300 to be connected to a power supply. The lighter portions of FIGS. 3B and 3C represent areas of relatively high temperatures (e.g. the location indicated by 312 in FIGS. 3B and 3C), and the darker portions of FIGS. 3B and 3C represent areas of relatively cool temperatures (e.g. the location indicated by 314 in FIGS. 3B and 3C). As shown, the lightest portions 312 are near the locations of terminals 310 of main breaker assembly 302 or power distribution block 306, especially near terminals 310 of main breaker assembly 302. That is, the greatest amount of heat is at areas near the terminals 310 of panelboard assembly 300.

In a panelboard assembly, heat is generated during operation, especially at terminals, where conductors are connected to components of the panelboard assembly. Conductors, breakers, and breaker assemblies are typically insulated, especially for a harsh and/or hazardous environment such that any arcing or sparking does not escape into air inside or outside of the enclosure, which may contain flammable or ignitable substances, and become a fire hazard. Therefore, heat is trapped inside the conductors, breakers, and breaker assemblies. If the heat is not dissipated from the electrical components, the components may become damaged or the temperature may rise high enough to pose as fire hazard, which is especially dangerous in a harsh and/or hazardous environment.

Additionally, in order for a panelboard assembly to meet certain certifications such as UL or IEC as described above, the maximum temperature rise of electrical components within a panelboard assembly should remain below a specified temperature rise. For example, maximum temperature rise of electrical components of a panelboard assembly should be 60° C. or less when the panelboard assembly is in operation. Difficulty in meeting the requirement increases when the current rating increases, especially when the current rating is 225 A or above. Known panelboard assemblies that meet the standard are relatively large when the panelboard assembly is rated at 225 A or greater. e.g., when operating at 225 A or greater, known A-size to G-size panelboard assemblies do not meet this requirement, while an H-size panelboard assembly, which is larger than A-size to G-size panelboard assemblies, may meet this requirement. An H-size panelboard assembly includes over 60 circuit breakers and has a height of over 6 feet (1.83 meters), which is bulky and expensive, and typically is not desirable to customers.

Accordingly, there is a need for a device that is used to help dissipate heat produced in a panelboard assembly, allowing a reduced-sized high-amperage panelboard assembly to be used to provide high amperage current. As used herein, a high-amperage panelboard assembly refers to a panelboard assembly that meets standards for panelboards to be used in a harsh and hazardous environment while operating at 225 A or above.

Figure 4A:
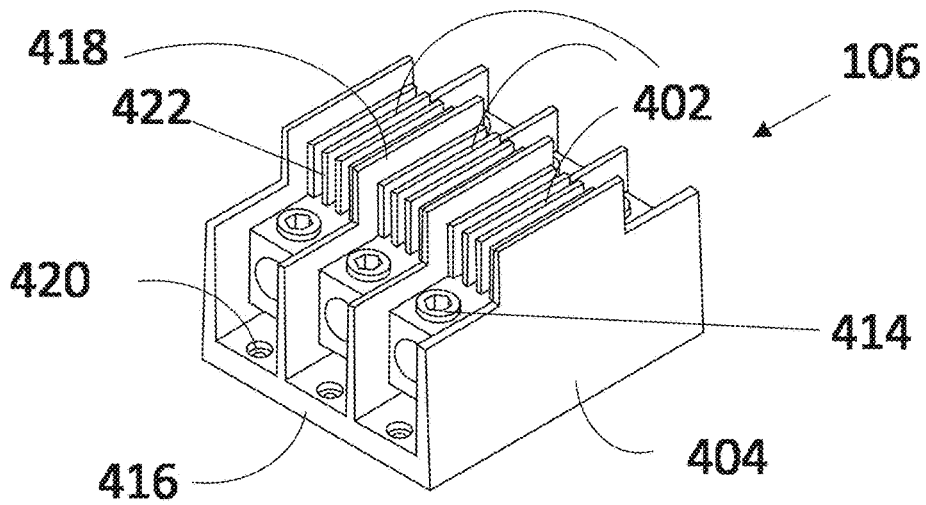
FIG. 4A is a perspective view of an exemplary power distribution heatsink assembly of the panelboard assembly shown in FIG. 1.
Figure 4B:
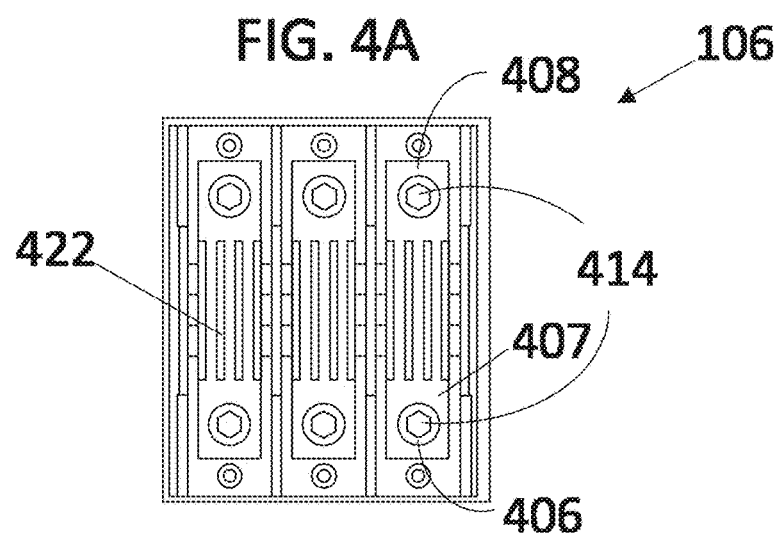
FIG. 4B is a top view of the power distribution heatsink assembly shown in FIG. 4A.

FIGS. 4A and 4B show an exemplary embodiment of power distribution heatsink assembly 106. FIG. 4A is a top perspective view of power distribution heatsink assembly 106. FIG. 4B is a top view of power distribution heatsink assembly 106. In the exemplary embodiment, power distribution heatsink assembly 106 includes heatsinks 402. In the depicted embodiment, power distribution heatsink assembly 106 includes three heatsinks 402, e.g., one for each phase of three-phase AC power. In some embodiments, power distribution heatsink assembly 106 includes four heatsinks 402, e.g., one for each of three phases of three-phase AC power and one for the neutral line or neutral conductor. In other embodiments, power distribution heatsink assembly 106 includes one heatsink 402 for DC power. The number of heatsinks 402 may be in other numbers such as two. The configured electrical connection of heatsinks 402 may be in other configurations such as being configured to be connected to slip-phase power. Heatsink 402 is fabricated from electrically conductive material such as metal like copper, copper alloy, aluminum, aluminum alloy, or nickel-plated aluminum or aluminum alloy to reduce corrosion. Heatsink 402 has a first end 406 and an opposing second end 408 (FIG. 4B), and a body 407 extending between first end 406 and second end 408. Heatsink 402 may further include fins 422 extending from body 407. Heatsink 402 further includes apertures 414 at first end 406 and/or second end 408. Apertures 414 are sized to receive conductors 140 (FIG. 2B) therein and provide points of electrical connection at which power distribution heatsink assembly 106 is electrically connected to other components of panelboard assembly 100.

In the exemplary embodiment, power distribution heatsink assembly 106 includes an isolator 404. Isolator 404 is fabricated from electrically nonconductive material or electrical insulator, such as plastic, epoxy or phenolic plastic, fiberglass, and/or ceramic. Isolator 404 electrically separates heatsinks 402. For example, if three heatsinks 402 are each electrically connected to separate phases of three-phase AC power, isolator 404 separates heatsinks 402 to prevent short circuiting between phases. Isolator 404 includes a base 416. Isolator 404 further includes a divider 418 that project from base 416 and separate adjacent heatsinks 402. Divider 418 provides electrical insulation between adjacent heatsinks 402. Isolator may include apertures 420, which may be used to, for example, mount power distribution heatsink assembly 106 onto panelboard assembly 100 such as enclosure 130 or mounting board 116.

In operation, power distribution heatsink assembly 106 is electrically connected to a component of panelboard assembly 100 such that power distribution heatsink assembly 106 is in the electrical path of panelboard assembly 100. In some embodiments, power distribution heatsink assembly 106 is a part of the circuit formed by other components of panelboard assembly 100, where both first and second ends 406, 408 of heatsinks 402 are electrically connected to the circuit such that electricity flows from another component of panelboard assembly 100 at one end 406, 408 of heatsink 402 to the other end 406, 408 of heatsink 402. In other embodiments, power distribution heatsink assembly 106 is electrically connected to other components of panelboard assembly 100, but does not form a circuit or a complete loop with other components of panelboard assembly 100. For example, first ends 406 of heatsinks 402 of power distribution heatsink assembly 106 are electrically connected to the electrical circuit or in the electrical path of the electrical circuit, but second ends 408 of heatsinks 402 are not electrically connected to the electrical circuit such as being electrically freestanding. In any configurations, because heatsink is directly connected to conductors 140, heat is directly transmitted from conductors 140 to heatsink 402 and dissipated through heatsink 402, reducing the temperature rise of panelboard assembly 100.

Figure 5:
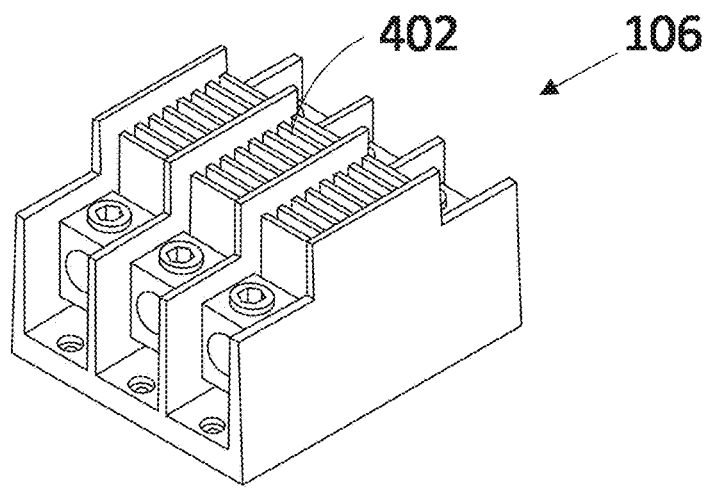
FIG. 5 is a perspective view of another exemplary power distribution heatsink assembly.

FIG. 5 shows another exemplary embodiment of a power distribution heatsink assembly 106. The exemplary embodiment of power distribution heatsink assembly 106 shown in FIG. 5 is similar to the exemplary embodiment of power distribution heatsink assembly 106 shown in FIGS. 4A and 4B except that heatsinks 402 shown in FIG. 5 includes a different number of fins 422 and a different orientation of fins 422. In the exemplary embodiment shown in FIG. 5, power distribution heatsink assembly 106 includes three heatsinks 402 that each include eight fins 422 with a major axis of each fin 422 being orthogonal to the major axis of the heatsinks 402. In other embodiments, however, power distribution heatsink assembly 106 may include any number of heatsinks 402 having any number of fins 422 in any orientation such that power distribution heatsink assembly 106 may function as described herein. Power distribution heatsink assembly 106 may include any number of isolators 404 having any shape and orientation such that power distribution heatsink assembly 106 may function as described herein.

Figure 6A:
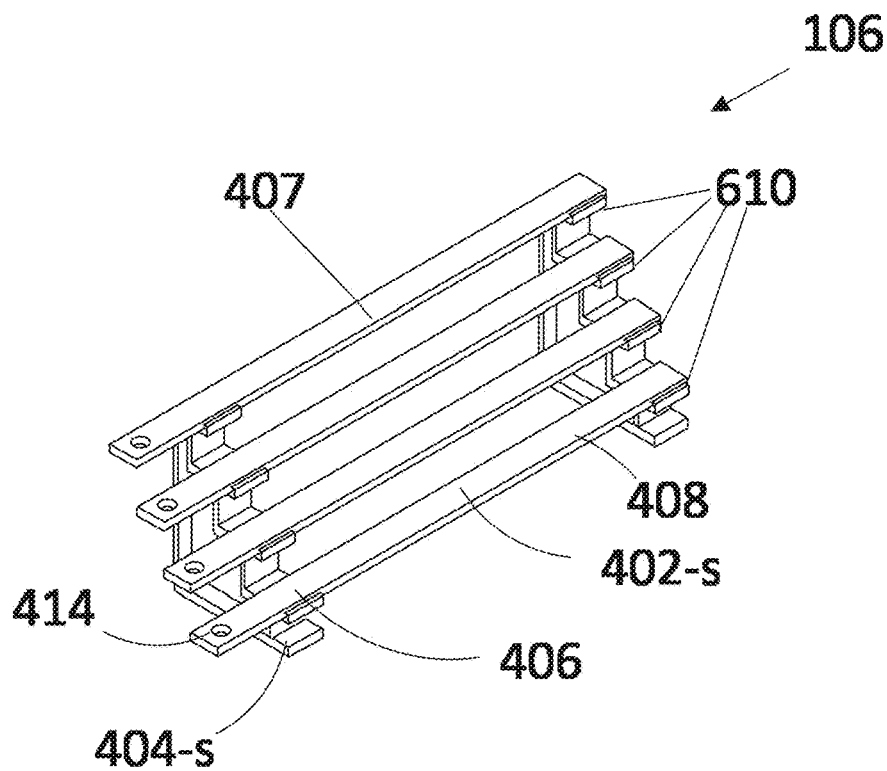
FIG. 6A is a perspective view of one more exemplary power distribution heatsink assembly.
Figure 6B:
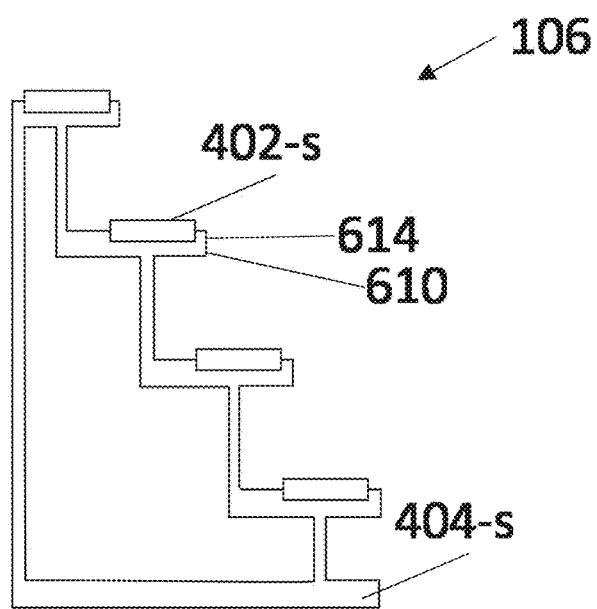
FIG. 6B is a side view of the power distribution heatsink assembly shown in FIG. 6A.

FIGS. 6A and 6B show one more exemplary embodiment of power distribution heatsink assembly 106. FIG. 6A is a perspective view of power distribution heatsink assembly 106. FIG. 6B is a side view of power distribution heatsink assembly 106. In the exemplary embodiment, power distribution heatsink assembly 106 includes heatsinks 402-*s* and isolator 404-*s*. Different from power distribution heatsink assembly 106 shown in FIGS. 4A, 4B, and 5, isolator 404-*s* includes a stepped structure that provides mechanical support and electrical isolation or insulation of heatsinks 402-*s*. Isolator 404-*s* includes steps 610. Each step 610 is positioned away from other steps 610. Steps 610 provides structural support to one of first end 406 or second end 408 of heatsinks 402-*s*.

In the exemplary embodiment, each heatsink 402-*s* spans between isolators 404-*s*, such that each first end 406 of heatsinks 402-*s* is attached to the same isolator 404-*s* and each second end 408 of heatsinks 402-*s* is attached to the same isolator 404-*s*. Each first end 406 and second end 408 of heatsink 402-*s* is attached to isolator 404-*s* at a corresponding step. Step 610 may include a groove 614 sized to receive heatsink 402-*s* therein at end 406, 408. Heatsink 402-*s* may be coupled to step 610 via, for example, adhesive or friction force between step 610 and heatsink 402-*s*.

In the exemplary embodiment, first end 406 of heatsink 402-*s* includes an aperture 414. Aperture 414 is sized to receive conductor 140 therethrough and used to electrically connect power distribution heatsink assembly 106 with other components of panelboard assembly 100. Power distribution heatsink assembly 106 does not form a circuit with other components of panelboard assembly 100. That is, first ends 406 of heatsinks 402-*s* are electrically connected to an electrical circuit of panelboard assembly 100, but second ends 408 of heatsinks 402-*s* are not electrically connected to the electrical circuit of panelboard assembly 100 (i.e. second ends 408 are freestanding and include no electrical connection). As a result, current does not flow through second end 408 and down to other components of panelboard assembly 100.

In the depicted embodiment, power distribution heatsink assembly 106 includes four heatsinks 402-*s* and two isolators 404-*s*. Alternatively, power distribution heatsink assembly 106 includes one isolator 404-*s*, which includes a stepped structure that spans from first end 406 to send end 408 of heatsink 402-*s*. Power distribution heatsink assembly 106 may include any number of isolators 404-*s* having any suitable shape and any number of heatsinks 402-*s* having any suitable shape and in any suitable configuration such that power distribution heatsink assembly 106 may function as described herein.

Figure 7:
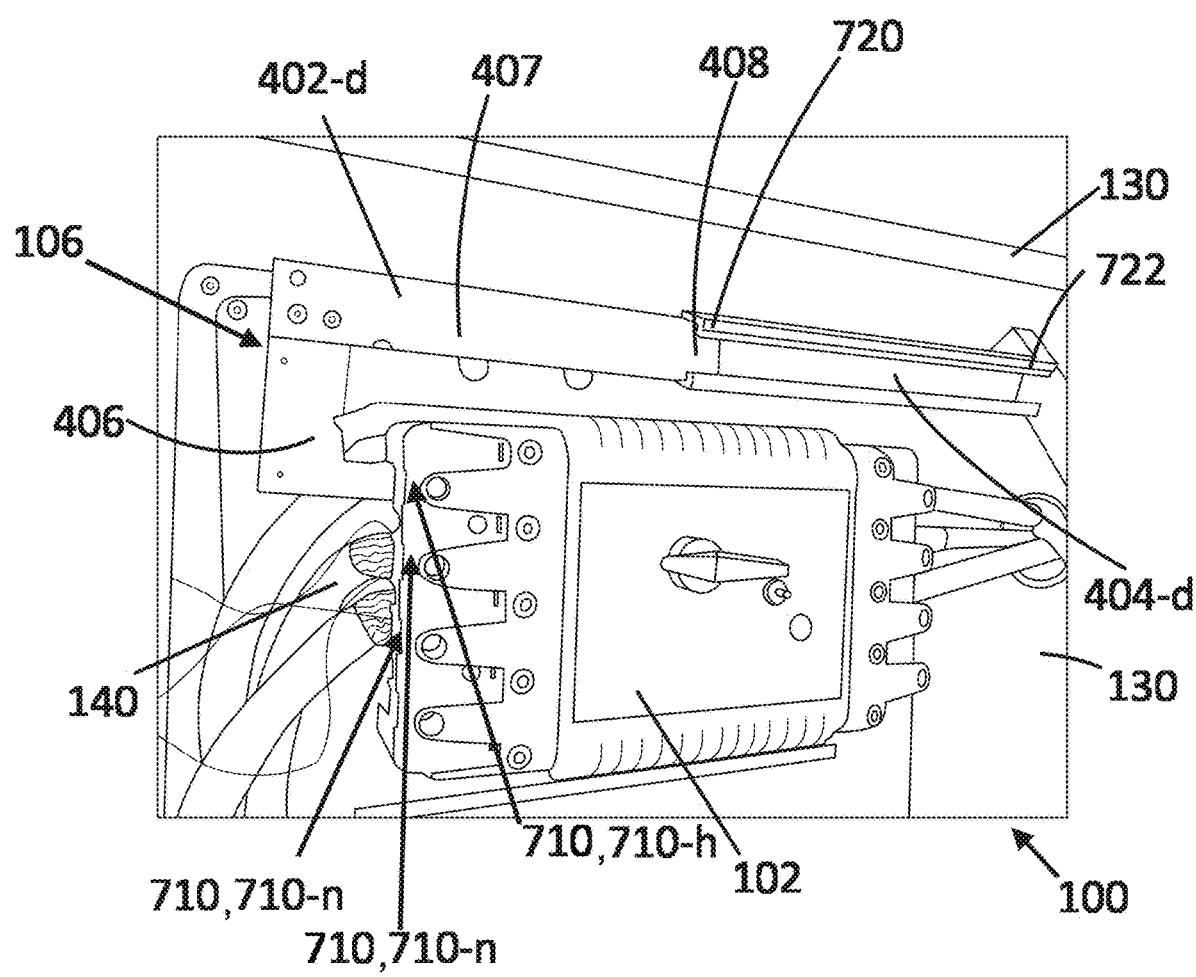
FIG. 7 is a front perspective view of one more power distribution heatsink assembly.

FIG. 7 shows one more exemplary embodiment of power distribution heatsink assembly 106. In the exemplary embodiment, power distribution heatsink assembly 106 includes heatsink 402-*d* and isolator 404-*d*. Heatsink 402-*d* has a first end 406 and a second end 408. Heatsink 402-*d* directly extends from a terminal 710-*h* of main breaker assembly 102 and is electrically connected to terminal 710-*h* at first end 406. At terminals 710-*n*, conductors 140 are electrically connected to core assembly 107 (shown in FIG. 2A). Alternatively, power distribution heatsink assembly 106 may be directly connected to a terminal of other components of panelboard assembly 100, such as a terminal of branch breaker assembly 104. Heatsink 402-*d* forms an "L" shape to increase a surface area of heatsink 402-*d* to enhance heat dissipation. Isolator 404-*d* includes first end 720 and second end 722. Second end 408 of heatsink 402 is attached to first end 720 of isolator 404-*d*. Second end 722 of isolator 404 is mounted to enclosure 130, such as a wall 132, of panelboard assembly 100. Power distribution heatsink assembly 106 does not form an electrical circuit with other components of panelboard assembly, where current does not flow through second end 408 of heatsink 402-d and down to other components of panelboard assembly 100. In one test, the temperature rise of terminal 710-*h* where power distribution heatsink assembly 106 is installed is approximately 15° C. less than other terminals 710-*n* that do not have power distribution heatsink assembly 106 installed.

In the exemplary embodiment, heatsink 402-*d* extends directly from terminal 710-*h* by being directly attached to terminal 710-*h*. In some embodiments, heatsink 402-*d* extends from a conductor 140 to be electrically connected to terminal 710-*h*.

When heatsink 402 does not form a circuit with other components of panelboard assembly 100 (see FIGS. 6A, 6B, and 7), because heatsink 402 of power distribution heatsink assembly 106 is electrically connected to other components of panelboard assembly 100 by being in an electrical path of panelboard assembly 100, heatsink 402 has electrical potential at the non-electrically connected end. Isolator 404 electrically insulates heatsink 402. For example, isolator 404 insulates heatsink from enclosure 130 when enclosure is fabricated from electrically-conductive material such as metal, to prevent enclosure 130 from having electrical potential.

In some embodiments, power distribution heatsink assembly 106 shown in FIGS. 6A-7 further include fins (fins not shown in FIGS. 6A, 6B, and 7) extending from heatsink body 407. Fins are used to increase heat dissipation.

Heatsinks 402 and/or fins 422 of power distribution heatsink assembly 106 are shown as planar for illustration purpose only. Heatsinks may be in other shapes such as oval or irregular shapes or may be curved or in any three-dimensional (3D) shapes.

Referring back to FIGS. 2A and 2B, in some embodiments, power distribution heatsink assembly 106 is located entirely within enclosure 130. Because locations near terminals 710 of main breaker assembly 102 have the most heat in panelboard assembly 100, power distribution heatsink assembly 106 is positioned proximate terminals 710 of main breaker assembly 102. In other embodiments, part of power distribution heatsink assembly is within enclosure 130 and part of power distribution heatsink assembly 106 is external to enclosure 130. For example, heatsink 402 may extend through enclosure 130 and dissipate heat out of enclosure 130. An external part of heatsink 402 may be positioned on a top 141 or on a side 142 of enclosure 130 (see FIG. 2A). Heatsink 402 may be surrounded or separated from enclosure 130 by isolator 404 at the intersection of heatsink 402 with enclosure 130 to prevent enclosure 130 from having electrical potential. Alternatively, another enclosure may be provided to enclose power distribution heatsink assembly 106 and enclosure 130 and to shield panelboard assembly 100. Having power distribution heatsink assembly 106 located partially outside of enclosure 130 increases heat dissipation.

In some embodiments, power distribution heatsink assembly 106 is modular where one or more power distribution heatsink assemblies 106 may be electrically connected at any suitable location to other components of panelboard assembly 100 and may be replaced or exchanged with other modules of power distribution heatsink assembly 106.

The above examples of the location of electrical connection and physical location of power distribution heatsink assembly 106 are presented in the context of only one power distribution heatsink assembly 106 being present. However, there may be any suitable number of power distribution heatsink assemblies 106 having any location of electrical connection and any physical location such that panelboard assembly 100 may function as described herein.

Figure 8:
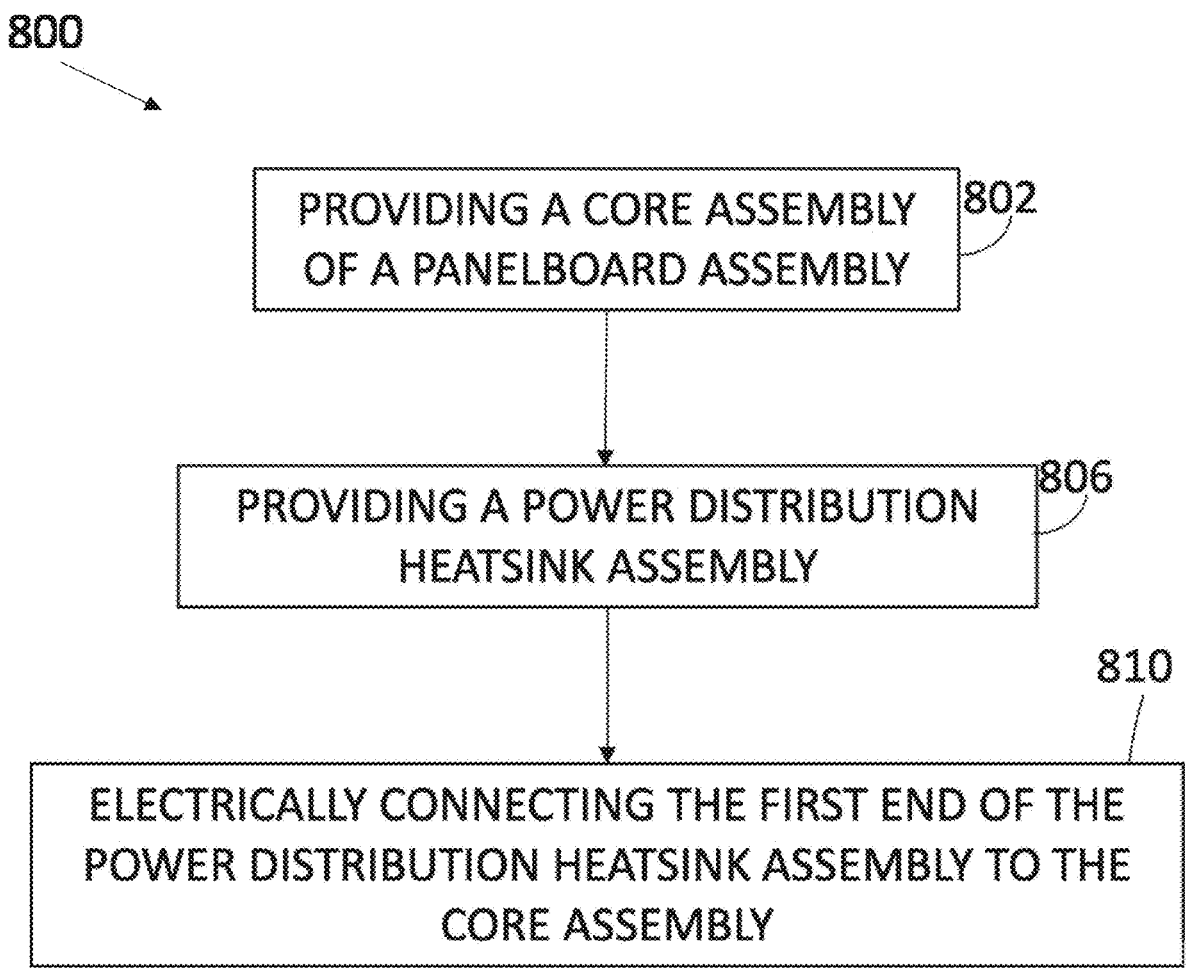
FIG. 8 is a flow chart illustrating an exemplary method of assembling an electrical assembly using panelboard assemblies and power distribution heatsink assemblies shown in FIGS. 1-7.

FIG. 8 is a flow chart of an exemplary method 800 of assembling an electrical assembly for a harsh and/or hazardous environment. In the exemplary embodiment, method 800 includes providing 802 a core assembly of a panelboard assembly. A core assembly may be any of the core assemblies 107 described above. Method 800 also includes providing 806 a power distribution heatsink assembly 106. A power distribution heatsink assembly 106 may be any of the power distribution heatsink assemblies 106 described above. Further, method 800 includes electrically connecting 810 a first end of the heatsink assembly to the core assembly. For example, power distribution heatsink assembly 106 may be electrically connected to a main breaker assembly 102, a branch breaker assembly 104, or other components of panelboard assembly 100. Power distribution heatsink assemblies 106 may or may not form an electrical circuit with core assembly 107 or other components of panelboard assembly 100.

The benefits and advantages of the inventive concepts are now believed to have been amply illustrated in relation to the exemplary embodiments disclosed.

At least one technical effect of the systems, assemblies, and methods described herein includes (a) heatsinks that reduce temperature rise in a high-amperage panelboard assembly by electrically connecting to a component of the panelboard assembly; and (b) power distribution heatsink assemblies that serve functions of heatsinks as well as power distribution blocks.

An embodiment of a panelboard assembly for a harsh and/or hazardous environment is disclosed. The panelboard assembly includes a core assembly. The core assembly includes a main breaker assembly configured to be electrically connected to a power supply, and a branch breaker assembly electrically connected to the main breaker assembly and configured to be electrically connected to one or more loads, and a power distribution heatsink assembly. The power distribution heatsink assembly includes an electrically-conductive heatsink having a first end and an opposing second end, the first end electrically connected to the core assembly and an electrically-nonconductive isolator electrically insulating the heatsink.

Optionally, the power distribution heatsink assembly is electrically connected to the main breaker assembly at the first end and electrically connected to the branch breaker assembly at the second end. The power distribution heatsink assembly is positioned proximate a terminal of the main breaker assembly. The heatsink defines an aperture at the first end, and the aperture is sized to receive a conductor of the core assembly. The power distribution heatsink assembly further includes a first heatsink and a second heatsink, the isolator positioned between the first heatsink and the second heatsink. The power distribution heatsink assembly further includes a first heatsink and a second heatsink, and the isolator further includes a first step and a second step spaced apart from one another, wherein the first heatsink is positioned on the first step and the second heatsink is positioned on the second step. The heatsink extends from a terminal of the core assembly. The power distribution heatsink assembly further includes a first heatsink electrically connected to a conductor of a first phase and a second heatsink electrically connected to at least one of a conductor of a second phase or a neutral conductor. The heatsink further includes a heatsink body extending between the first end and the second end and a plurality of fins extending from the heatsink body. The power distribution heatsink assembly is modular. The panelboard assembly further includes a mounting board having a first side and a second side opposite the first side, wherein the core assembly is mounted on the first side, and the power distribution heatsink assembly is mounted on the second side. The panelboard assembly further includes an enclosure surrounding the core assembly, wherein a portion of the heatsink is positioned exterior of the enclosure. The panelboard assembly further includes an enclosure surrounding the core assembly, wherein the power distribution heatsink assembly is mounted on an interior wall of the enclosure. The first end and the second end of the heatsink do not define a closed electrical loop with the core assembly.

An embodiment of a power distribution heatsink assembly of a panelboard assembly for a harsh and/or hazardous environment is disclosed. The panelboard assembly includes a core assembly. The core assembly includes a main breaker assembly and a branch breaker assembly. The power distribution heatsink assembly includes an electrically-conductive heatsink having a first end and an opposing second end, the first end configured to be electrically connected to the core assembly and an electrically-nonconductive isolator electrically insulating the heatsink.

Optionally, the power distribution heatsink assembly further includes a first heatsink and a second heatsink, the isolator positioned between the first heatsink and the second heatsink. The power distribution heatsink assembly further includes a first heatsink and a second heatsink, and the isolator further includes a first step and a second step spaced apart from one another, wherein the first heatsink is positioned on the first step and the second heatsink is positioned on the second step. The heatsink defines a first aperture at the first end, the first aperture sized to receive a first conductor of the core assembly. The heatsink defines a second aperture at the second end, the second aperture sized to receive a second conductor of the core assembly. The heatsink is sized to extend from a terminal of the core assembly.

While exemplary embodiments of components, assemblies and systems are described, variations of the components, assemblies and systems are possible to achieve similar advantages and effects. Specifically, the shape and the geometry of the components and assemblies, and the relative locations of the components in the assembly, may be varied from that described and depicted without departing from inventive concepts described. Also, in certain embodiments, certain components in the assemblies described may be omitted to accommodate particular types of panelboard assemblies, or the needs of particular installations, while still providing cost effective panelboard assemblies for electrical wiring or cabling.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

Aspects of the Disclosure

1. A panelboard assembly for a harsh and/or hazardous environment, comprising: a core assembly comprising:
   a main breaker assembly configured to be electrically connected to a power supply; and
   a branch breaker assembly electrically connected to the main breaker assembly and configured to be electrically connected to one or more loads; and
   a power distribution heatsink assembly comprising:
      an electrically-conductive heatsink having a first end and an opposing second end, the first end electrically connected to the core assembly; and
      an electrically-nonconductive isolator electrically insulating the heatsink.

2. The panelboard assembly of aspect 1, wherein the power distribution heatsink assembly is electrically connected to the main breaker assembly at the first end and electrically connected to the branch breaker assembly at the second end.

3. The panelboard assembly of aspect 1, wherein the power distribution heatsink assembly is positioned proximate a terminal of the main breaker assembly.

4. The panelboard assembly of aspect 1, wherein the heatsink defines an aperture at the first end, and the aperture is sized to receive a conductor of the core assembly.

5. The panelboard assembly of aspect 1, wherein the power distribution heatsink assembly further comprises a first heatsink and a second heatsink, the isolator positioned between the first heatsink and the second heatsink.

6. The panelboard assembly of aspect 1, wherein the power distribution heatsink assembly further comprises a first heatsink and a second heatsink, and the isolator further comprises a first step and a second step spaced apart from one another, wherein the first heatsink is positioned on the first step and the second heatsink is positioned on the second step.

7. The panelboard assembly of aspect 1, wherein the heatsink extends from a terminal of the core assembly.

8. The panelboard assembly of aspect 1, wherein the power distribution heatsink assembly further comprises:
   a first heatsink electrically connected to a conductor of a first phase; and
   a second heatsink electrically connected to at least one of a conductor of a second phase or a neutral conductor.

9. The panelboard assembly of aspect 1, wherein the heatsink further comprises a heatsink body extending between the first end and the second end and a plurality of fins extending from the heatsink body.

10. The panelboard assembly of aspect 1, wherein the power distribution heatsink assembly is modular.

11. The panelboard assembly of aspect 1, further comprising a mounting board having a first side and a second side opposite the first side, wherein the core assembly is mounted on the first side, and the power distribution heatsink assembly is mounted on the second side.

12. The panelboard assembly of aspect 1, further comprising an enclosure surrounding the core assembly, wherein a portion of the heatsink is positioned exterior of the enclosure.

13. The panelboard assembly of aspect 1, further comprising an enclosure surrounding the core assembly, wherein the power distribution heatsink assembly is mounted on an interior wall of the enclosure.

14. The panelboard assembly of aspect 1, wherein the first end and the second end of the heatsink do not define a closed electrical loop with the core assembly.

15. A power distribution heatsink assembly of a panelboard assembly for a harsh and/or hazardous environment, the panelboard assembly including a core assembly that includes a main breaker assembly and a branch breaker assembly, the power distribution heatsink assembly comprising:
an electrically-conductive heatsink having a first end and an opposing second end, the first end configured to be electrically connected to the core assembly; and
an electrically-nonconductive isolator electrically insulating the heatsink.

16. The power distribution heatsink assembly of aspect 15, wherein the power distribution heatsink assembly further comprises a first heatsink and a second heatsink, the isolator positioned between the first heatsink and the second heatsink.

17. The power distribution heatsink assembly of aspect 15, wherein the power distribution heatsink assembly further comprises a first heatsink and a second heatsink, and the isolator further comprises a first step and a second step spaced apart from one another, wherein the first heatsink is positioned on the first step and the second heatsink is positioned on the second step.

18. The power distribution heatsink assembly of aspect 15, wherein the heatsink defines a first aperture at the first end, the first aperture sized to receive a first conductor of the core assembly.

19. The power distribution heatsink assembly of aspect 18, wherein the heatsink defines a second aperture at the second end, the second aperture sized to receive a second conductor of the core assembly.

20. The power distribution heatsink assembly of aspect 15, wherein the heatsink is sized to extend from a terminal of the core assembly.

What is claimed is:

1. A panelboard assembly for a harsh and/or hazardous environment, comprising:
a core assembly comprising:
a main breaker assembly configured to be electrically connected to a power supply; and
a branch breaker assembly electrically connected to the main breaker assembly and configured to be electrically connected to one or more loads; and
a power distribution heatsink assembly comprising:
an electrically-conductive heatsink having a first end and an opposing second end, the first end electrically connected to the core assembly; and
an electrically-nonconductive isolator electrically insulating the electrically-conductive heatsink.

2. The panelboard assembly of claim 1, wherein the power distribution heatsink assembly is electrically connected to the main breaker assembly at the first end and electrically connected to the branch breaker assembly at the opposing second end.

3. The panelboard assembly of claim 1, wherein the power distribution heatsink assembly is positioned proximate a terminal of the main breaker assembly.

4. The panelboard assembly of claim 1, wherein the electrically-conductive heatsink defines an aperture at the first end, and the aperture is sized to receive a conductor of the core assembly.

5. The panelboard assembly of claim 1, wherein the electrically-conductive heatsink is a first heatsink and wherein the power distribution heatsink assembly further comprises a second heatsink, the electrically-nonconductive isolator positioned between the first heatsink and the second heatsink.

6. The panelboard assembly of claim 1, wherein the electrically-conductive heatsink is a first heatsink and wherein the power distribution heatsink assembly further comprises a second heatsink, and the electrically-nonconductive isolator further comprises a first step and a second step spaced apart from one another, wherein the first heatsink is positioned on the first step and the second heatsink is positioned on the second step.

7. The panelboard assembly of claim 1, wherein the electrically-conductive heatsink extends from a terminal of the core assembly.

8. The panelboard assembly of claim 1, wherein the electrically-conductive heatsink is a first heat sink electrically connected to a conductor of a first phase; and wherein the power distribution heatsink assembly further comprises:
a second heatsink electrically connected to at least one of a conductor of a second phase or a neutral conductor.

9. The panelboard assembly of claim 1, wherein the electrically-conductive heatsink further comprises a heatsink body extending between the first end and the opposing second end and a plurality of fins extending from the electrically-conductive heatsink body.

10. The panelboard assembly of claim 1, wherein the power distribution heatsink assembly is modular.

11. The panelboard assembly of claim 1, further comprising a mounting board having a first side and a second side opposite the first side, wherein the core assembly is mounted on the first side, and the power distribution heatsink assembly is mounted on the second side.

12. The panelboard assembly of claim 1, further comprising an enclosure surrounding the core assembly, wherein a portion of the electrically-conductive heatsink is positioned exterior of the enclosure.

13. The panelboard assembly of claim 1, further comprising an enclosure surrounding the core assembly, wherein the power distribution heatsink assembly is mounted on an interior wall of the enclosure.

14. The panelboard assembly of claim 1, wherein the first end and the opposing second end of the electrically-conductive heatsink do not define a closed electrical loop with the core assembly.

15. A power distribution heatsink assembly of a panelboard assembly for a harsh and/or hazardous environment, the panelboard assembly including a core assembly that includes a main breaker assembly and a branch breaker assembly, the power distribution heatsink assembly comprising:
an electrically-conductive heatsink having a first end and an opposing second end, the first end configured to be electrically connected to the core assembly; and
an electrically-nonconductive isolator electrically insulating the electrically-conductive heatsink.

16. The power distribution heatsink assembly of claim 15, wherein the electrically-conductive heatsink is a first heat sink and wherein the power distribution heatsink assembly further comprises a second heatsink, the electrically-nonconductive isolator positioned between the first heatsink and the second heatsink.

17. The power distribution heatsink assembly of claim 15, wherein the electrically-conductive heatsink is a first heat sink and wherein the power distribution heatsink assembly further comprises a second heatsink, and the electrically-nonconductive isolator further comprises a first step and a second step spaced apart from one another, wherein the first heatsink is positioned on the first step and the second heatsink is positioned on the second step.

18. The power distribution heatsink assembly of claim 15, wherein the electrically-conductive heatsink defines a first aperture at the first end, the first aperture sized to receive a first conductor of the core assembly.

19. The power distribution heatsink assembly of claim 18, wherein the electrically-conductive heatsink defines a second aperture at the opposing second end, the second aperture sized to receive a second conductor of the core assembly.

20. The power distribution heatsink assembly of claim 15, wherein the electrically-conductive heatsink is sized to extend from a terminal of the core assembly.

\* \* \* \* \*